United States Patent
Chen et al.

(10) Patent No.: US 9,385,076 B2
(45) Date of Patent: Jul. 5, 2016

(54) SEMICONDUCTOR DEVICE WITH BUMP STRUCTURE ON AN INTERCONNCET STRUCTURE

(75) Inventors: Hsien-Wei Chen, Sinying (TW); Yi-Wen Wu, Xizhi (TW); Wen-Hsiung Lu, Jhonghe (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 300 days.

(21) Appl. No.: 13/313,677

(22) Filed: Dec. 7, 2011

(65) Prior Publication Data

US 2013/0147031 A1  Jun. 13, 2013

(51) Int. Cl.
*H01L 23/498* (2006.01)
*H01L 21/60* (2006.01)
*H01L 23/00* (2006.01)
*H01L 23/31* (2006.01)

(52) U.S. Cl.
CPC .......... *H01L 23/49838* (2013.01); *H01L 24/11* (2013.01); *H01L 23/3192* (2013.01); *H01L 24/05* (2013.01); *H01L 24/13* (2013.01); *H01L 2224/02125* (2013.01); *H01L 2224/02165* (2013.01); *H01L 2224/0401* (2013.01); *H01L 2224/05008* (2013.01); *H01L 2224/05124* (2013.01); *H01L 2224/05147* (2013.01); *H01L 2224/05155* (2013.01); *H01L 2224/05164* (2013.01); *H01L 2224/05548* (2013.01); *H01L 2224/05552* (2013.01); *H01L 2224/05567* (2013.01); *H01L 2224/05569* (2013.01); *H01L 2224/05572* (2013.01); *H01L 2224/05609* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/13022* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2924/15788* (2013.01)

(58) Field of Classification Search
CPC ...... H01L 23/485; H01L 23/498; H01L 21/60
USPC .......... 257/737, 738, 778, E23.068, E21.508; 438/613
See application file for complete search history.

(56) References Cited

U.S. PATENT DOCUMENTS

| 5,466,635 A | 11/1995 | Lynch et al. |
| 6,218,281 B1 | 4/2001 | Watanabe et al. |
| 6,229,220 B1 | 5/2001 | Saitoh et al. |

(Continued)

FOREIGN PATENT DOCUMENTS

| JP | 5-335313 | 12/1993 |
| JP | 2000-228420 | 8/2000 |

*Primary Examiner* — Sheng Zhu
(74) *Attorney, Agent, or Firm* — Hauptman Ham, LLP

(57) ABSTRACT

A semiconductor device includes a post-passivation interconnect (PPI) structure having a landing pad region. A polymer layer is formed on the PPI structure and patterned with a first opening and a second opening to expose portions of the landing pad region. The second opening is a ring-shaped opening surrounding the first opening. A bump structure is formed on the polymer layer to electrically connect the landing pad region through the first opening and the second opening.

20 Claims, 7 Drawing Sheets

(56) References Cited

U.S. PATENT DOCUMENTS

| | | |
|---|---|---|
| 6,472,763 B2 * | 10/2002 | Fukuda et al. ............... 257/780 |
| 6,578,754 B1 | 6/2003 | Tung |
| 6,592,019 B2 | 7/2003 | Tung |
| 6,818,545 B2 | 11/2004 | Lee et al. |
| 6,853,076 B2 | 2/2005 | Datta et al. |
| 6,917,119 B2 | 7/2005 | Lee et al. |
| 7,064,436 B2 | 6/2006 | Ishiguri et al. |
| 7,391,112 B2 | 6/2008 | Li et al. |
| 7,495,304 B2 * | 2/2009 | Lin et al. ...................... 257/432 |
| 7,741,714 B2 * | 6/2010 | Huang et al. .................. 257/754 |
| 2002/0096757 A1 * | 7/2002 | Takao et al. ................... 257/690 |
| 2005/0133894 A1 * | 6/2005 | Bohr et al. .................... 257/678 |
| 2007/0120269 A1 * | 5/2007 | Hsieh et al. ................... 257/778 |
| 2007/0278675 A1 * | 12/2007 | Okada .......................... 257/738 |
| 2010/0090318 A1 | 4/2010 | Hsu et al. |
| 2011/0049705 A1 | 3/2011 | Liu et al. |

\* cited by examiner

SEMICONDUCTOR DEVICE WITH BUMP STRUCTURE ON AN INTERCONNCET STRUCTURE

RELATED APPLICATION

The present application is related to co-pending U.S. filing Ser. No. 13/272,540 filed on Oct. 13, 2011, which is expressly incorporated by reference herein in its entirety

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as via openings and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump actually contains the bump itself and an "under bump metallurgy" (UBM) located between the bump and an I/O pad.

Wafer level chip scale packaging (WLCSP) is currently widely used for its low cost and relatively simple processes. In a typical WLCSP, post-passivation interconnect (PPI) lines such as redistribution lines (RDLs) are formed on passivation layers, followed by the formation of polymer films and bumps. PPI formation processes, however, have polymer film peeling issues, which may induce weak interfaces in the PPI structure and cause failures in the device.

DETAILED DESCRIPTION

Figure 1:
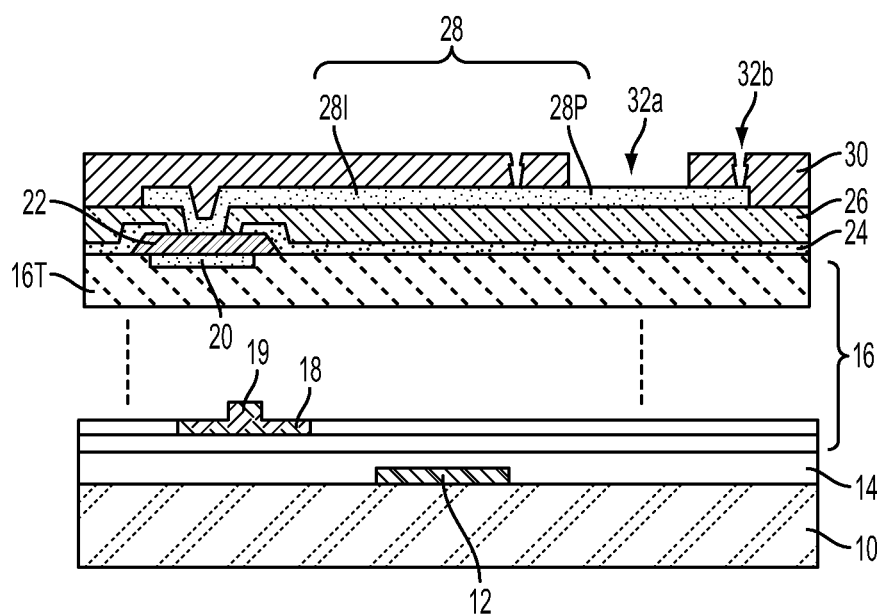
FIG. 1 is a cross-sectional view of a semiconductor device used for forming a bump structure on a PPI structure in accordance with an exemplary embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 is a cross-sectional view illustrating a semiconductor device used for forming a bump structure on a PPI structure in accordance with an exemplary embodiment.

Referring to FIG. 1, a portion of a substrate 10 having electrical circuitry 12 formed thereon is shown in accordance with an embodiment. The substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as a multi-layered or gradient substrate may also be used.

Electrical circuitry 12 formed on the substrate 10 may be any type of circuitry suitable for a particular application. In an embodiment, the electrical circuitry 12 includes electrical devices formed on the substrate 10 with one or more dielectric layers overlying the electrical devices. Metal layers can be formed between dielectric layers to route electrical signals between the electrical devices. Electrical devices can also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 14. The ILD layer 14 can be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). It should also be noted that the ILD layer 14 can comprise a plurality of dielectric layers. Contacts (not shown) can be formed through the ILD layer 14 to provide an electrical contact to the electrical circuitry 12. The contacts can be formed of, for example, one or more layers of TaN, Ta, TiN, Ti, CoW, copper, tungsten, aluminum, silver, or the like, or combinations thereof.

One or more inter-metal dielectric (IMD) layers 16 and the associated metallization layers are formed over the ILD layer 14. Generally, the one or more IMD layers 16 and the associated metallization layers (including metal lines 18, via openings 19 and metal layers 20) are used to interconnect the electrical circuitry 12 to each other and to provide an external electrical connection. The IMD layers 16 can be formed of a low-K dielectric material, such as FSG formed by PECVD techniques or high-density plasma CVD (HDPCVD), or the like, and can include intermediate etch stop layers. It should be noted that one or more etch stop layers (not shown) can be positioned between adjacent ones of the dielectric layers, e.g., the ILD layer 14 and the IMD layers 16. Generally, the etch stop layers provide a mechanism to stop an etching process when forming via openings and/or contacts. The etch stop layers are formed of a dielectric material having a different etch selectivity from adjacent layers, e.g., the underlying semiconductor substrate 10, the overlying ILD layer 14, and the overlying IMD layers 16. In an embodiment, etch stop layers can be formed of SiN, SiCN, SiCO, CN, combinations thereof, or the like, deposited by CVD or PECVD techniques.

The metallization layers including metal lines 18 and via openings 19 can be formed of copper or copper alloys, although they can also be formed of other metals. Further, the metallization layers include a top metal layer 20 formed and patterned in or on the uppermost IMD layer 16T to provide external electrical connections and to protect the underlying layers from various environmental contaminants. The uppermost IMD layer 16T can be formed of a dielectric material, such as silicon nitride, silicon oxide, undoped silicon glass, and the like. In subsequent cross-sectional drawings, semiconductor substrate 10, electrical circuitry 12, ILD layer 14, IMD layers 16, and metallization layers 18 and 19 are not illustrated, and the top metal layer 20 is formed as a part of the top metallization layer on the uppermost IMD layer 16T.

Thereafter, a conductive pad 22 is formed to contact the top metal layer 20, or alternatively, electrically coupled to top metal layer 20 through a via. The conductive pad 22 can be formed of aluminum, aluminum copper, aluminum alloys, copper, copper alloys, or the like. One or more passivation layers, such as passivation layer 24, are formed over the conductive pads 22 and the uppermost IMD layer 16T. The passivation layer 24 can be formed of a dielectric material, such as undoped silicate glass (USG), silicon nitride, silicon oxide, silicon oxynitride or a non-porous material by any suitable method, such as CVD, PVD, or the like. The passivation layer 24 can be a single layer or a laminated layer. One of ordinary skill in the art will appreciate that a single layer of conductive pad and a passivation layer are shown for illustrative purposes only. As such, other embodiments can include any number of conductive layers and/or passivation layers. The passivation layer 24 is then patterned by the use of masking methods, lithography technologies, etching processes, or combinations thereof, such that an opening is formed to expose a portion of conductive pad 22. In an embodiment, the passivation layer 24 is patterned to cover the peripheral portion of the conductive pad 22, and to expose the central portion of conductive pad 22 through the opening.

Next, a first protective layer 26 is formed on the passivation layer 24. The first protective layer 26 can fill the opening in the passivation layer 24. The first protective layer 26 is patterned to form another opening through which at least a portion of the conductive pad 22 is exposed again. The first protective layer 26 can be, for example, a polymer layer. The polymer layer can be formed of a polymer material such as an epoxy, polyimide, benzocyclobutene (BCB), polybenzoxazole (PBO), and the like, although other relatively soft, often organic, dielectric materials can also be used. The formation methods include spin coating or other methods. In some embodiments, the first protective layer 26 is an optional layer, which can be skipped in the semiconductor device.

Thereafter, a PPI structure 28 is formed and patterned to electrically connect the conductive pad 22. In an embodiment, the PPI structure 28 is formed on the first protective layer 26 and electrically connected to the conductive pad 22 through the opening in the first protective layer 26. The PPI structure 28 includes an interconnect line region 28I and a landing pad region 28P. The interconnect line region 28I and the landing pad region 28P can be formed simultaneously, and may be formed of a same conductive material. In an embodiment, the interconnect line region 28I extends to electrically connect the conductive pad 22 through the opening in the first protective layer 26, and a bump structure will be formed over and electrically connected to the landing pad region 28P in subsequent processes. The PPI structure 28 is a metallization layer, which may include, but not limited to, for example copper, aluminum, copper alloy, nickel or other mobile conductive materials using plating, electroless plating, sputtering, chemical vapor deposition methods, and the like. In some embodiments, the PPI structure 28 may further include a nickel-containing layer (not shown) on top of a copper-containing layer. In some embodiments, the PPI structure 28 can also function as power lines, re-distribution lines (RDL), inductors, capacitors or any passive components. Through the routing of PPI structure 28, the landing pad region 28P may be, or may not be, directly over the conductive pad 22.

Then a second protective layer 30 is formed on the substrate 10 to cover the PPI structure 28. In an embodiment, the second protective layer 30 is formed to cover the exposed portions of the first protective layer 26. In some embodiments, the second protective layer 30 is formed of a polymer layer, such as an epoxy, polyimide, benzocyclobutene (BCB), polybenzoxazole (PBO), and the like, although other relatively soft, often organic, dielectric materials may also be used. In some embodiments, the second protective layer 30 is formed of a non-organic material selected from un-doped silicate glass (USG), silicon nitride, silicon oxynitride, silicon oxide, and combinations thereof.

Using photolithography and/or etching processes, the second protective layer 30 is further patterned to form a first opening 32a and at least a second opening 32b, exposing portions of the landing pad region 28P. In an embodiment, the second opening 32b is smaller than the first opening 32a. A bump structure will be formed to electrically connect the landing pad region 28P through the openings 32a and 32b.

Figure 2:
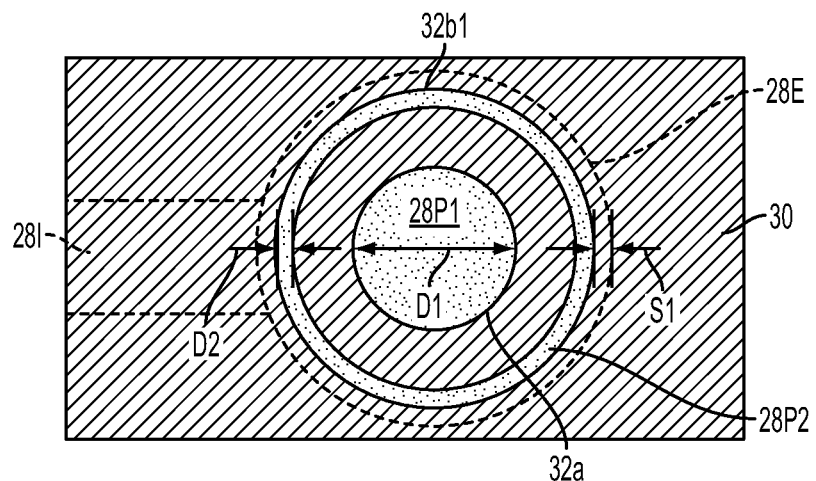
FIGS. 2 and 3 are top views of openings formed in a protective layer in accordance with exemplary embodiments.

FIG. 2 is a top view illustrating the placement of openings 32a and 32b1 in the second protective layer 30 according to an embodiment. The first opening 32a with a first dimension D1 exposes a first portion 28P1 of the landing pad region 28P, and the second opening 32b1 with a second dimension D2 exposes a second portion 28P2 of the landing pad region 28P. The second opening 32b1 is a continuous ring-shaped opening surrounding the first opening 32a. The second opening 32b1 is adjacent to an edge 28E of the landing pad region 28P with a space S1. The dimensions D1, D2 and S1 may vary according to the bump pitch designs. In an embodiment, the dimension ratio of D1 to D2 is greater than 10. For example, the first dimension D1 is between about 100 μm. and about 300 μm, and the second dimension D2 is between about 1 μm and about 10 um. In an embodiment, the space S1 is between about 1 μm and about 10 um.

Figure 3:
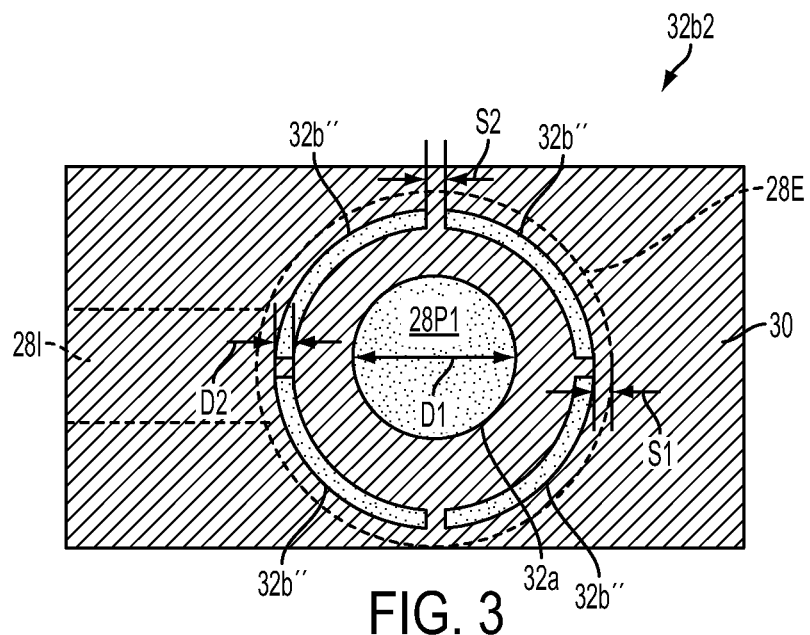

FIG. 3 is a top view illustrating the other placement of openings 32a and 32b2 in the second protective layer 30 according to exemplary embodiments. Outside the first opening 32a, a second opening 32b2 is a discontinuous ring-shaped opening including at least two sub-openings 32b" separated from each other with a space S2. In an embodiment, the space S2 is between about 1 μm and about 30 μm. For example, S2 is between about 10 μm and about 30 μm. In an embodiment, the number of the separated sub-openings 32b" is between two and ten, and the spaces S2 between the sub-openings 32b" can be equal or different. FIG. 3 shows the discontinuous ring-shaped opening 32b2 includes four separated sub-openings 32b". The placement and the shape of the sub-openings 32b" are provided for illustrative purposes only and that the specific locations and patterns of the sub-openings 32b" may vary and may include, for example, an array of openings, lines of openings, staggered openings, a mesh-shape opening or the like. The illustrated opening sizes are provided for reference only and are not intended to be actual sizes or actual relative sizes.

Figure 4:
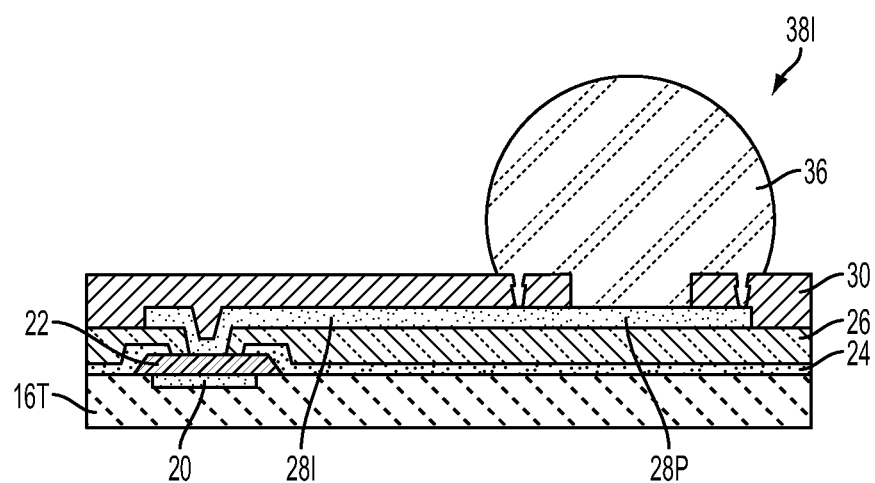
FIG. 4 is a cross-sectional view of a bump structure formed on a PPI structure in accordance with an exemplary embodiment.

After patterning the second protective layer 30 with the openings 32a and 32b, a solder bump 36 is formed as shown in FIG. 4. The solder bump 36 contacts and electrically connects the landing pad region 28P through the openings 32a and 32b in the second protective layer 30. In an embodiment, the solder bump 36 fills the first opening 32a and the second opening 32b of the second protective layer 30. In one embodiment, the solder bump 36 is formed by attaching a solder ball on the landing pad region 28P followed by a solder reflowing process. The solder bump 36 may include a lead-free pre-solder layer, SnAg, or a solder material including alloys of tin, lead, silver, copper, nickel, bismuth, or combinations thereof. In some embodiments, the solder bump can be formed by a plating process with photolithography technologies. A bump structure 38I is therefore completed on a semiconductor device. The presented embodiments provide the second opening 32b in the second protective layer 30 to reinforce the package performance during reliability testing. This can improve the strength in the PPI structure and the bump structure, and the peeling and cracking of the polymer layer may be reduced and/or eliminated. Accordingly, in packaging assembly processes, joint reliability can be increased and bump fatigue can be reduced.

Figure 5:
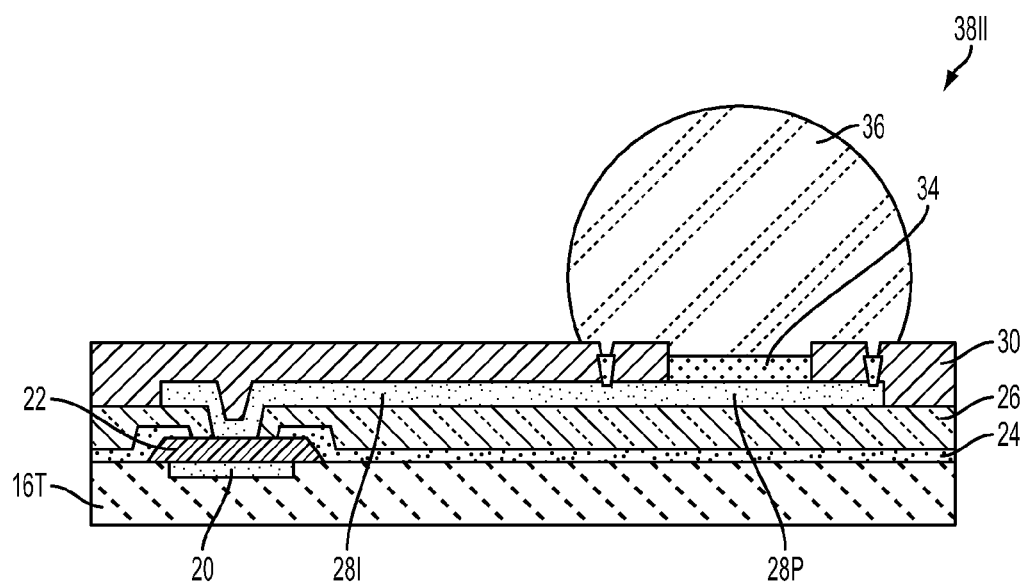
FIG. 5 is a cross-sectional view of a bump structure formed on a PPI structure in accordance with another exemplary embodiment.
Figure 8:
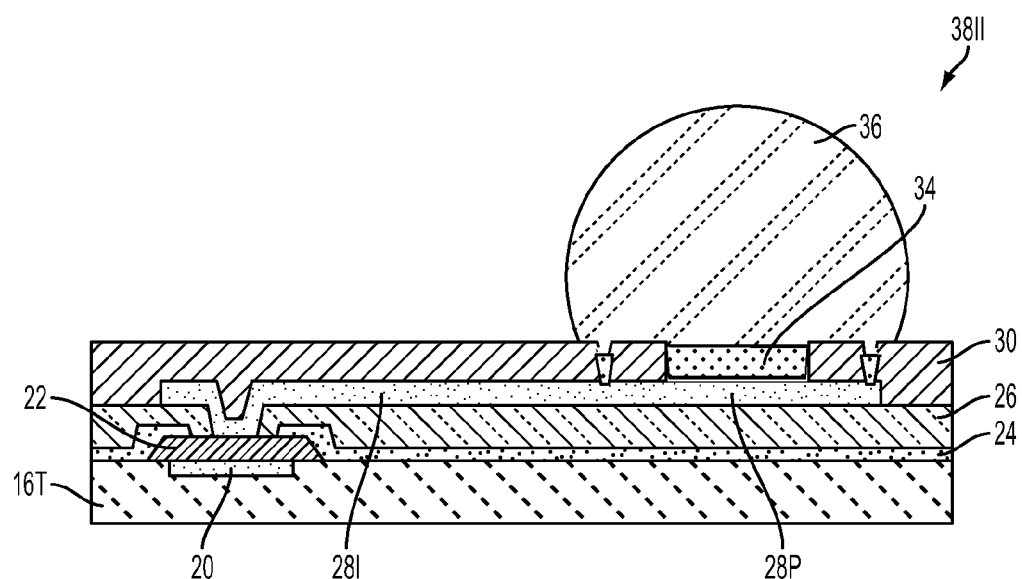
FIG. 8 is a cross-sectional view of a bump structure formed on a PPI structure in accordance with some embodiments.

FIG. 5 is a cross-section view illustrating another bump structure formed on the PPI structure. Unless specified otherwise, the reference numerals in the embodiment represent like elements in the embodiment illustrated in FIGS. 1-4. After the formation of the second protective layer 30 with the first opening 32a and the second opening 32b, the process proceeds to the formation of a barrier layer 34 within the openings 32a and 32b. The barrier layer 34 is formed on the exposed portions 28P1 and 28P2 of the landing pad region 28P within the openings 32a and 32b. The formation of the barrier layer 34 may prevent copper in the PPI structure 28 from diffusing into bonding material, such as solder material, that is used to bond the substrate 10 to external features. The prevention of copper diffusion increases the reliability and bonding strength of the package. The barrier layer 34 may include nickel (Ni), tin, tin-lead (SnPb), gold (Au), silver, palladium (Pd), indium (In), nickel-palladium-gold (NiPdAu), nickel-palladium (NiPd), nickel-gold (NiAu), a Ni-based alloy, an Au-based alloy, or a Pd-based alloy, other similar materials, or an alloy by an electroless plating process or an immersion plating process. In at least one embodiment, the barrier layer 34 in the first opening 32a has a first height H1, and the barrier layer 34 is the second opening 32b has a second height H2, in which H1 is less than or equal to H2. In some embodiments, the ratio of H2 to H1 is between about 1.0 and about 1.5. For example, the ratio H2/H1 is about 1.2-1.5. In some embodiments, the height H1 of the barrier layer 34 is between about 1 μm and about 10 μm, and the height H2 is between about 1 and about 15 μm. For example, the height H1 is about 6-10 μm. FIG. 8 is a cross-sectional view of another bump structure having a height of barrier layer 34 in first opening 32a higher than a height of barrier layer 34 in second opening 32b.

The barrier layer 34 may be formed of one or more than one electroless metal layers. In one embodiment, the barrier layer 34 is a triple-layer structure including an electroless Ni layer, an electroless Pd layer, and an immersion Au layer, which is also known as an ENEPIG structure. For example, the ENEPIG structure may have the electroless Ni layer with a thickness of at least 2 the electroless Pd layer with a thickness of at least 0.02 μm and the immersion Au layer with a thickness of at least 0.01 μm. In one embodiment, the barrier layer 34 is a dual-layer structure including an electroless Ni layer and an electroless Pd layer, named an ENEP structure. In one embodiment, the barrier layer 34 is a single-layer structure including an electroless Ni layer, which is also known as an EN structure. In one embodiment, the barrier layer 34 is a dual-layer structure including an electroless Ni layer and an immersion Au layer, which is also known as an ENIG structure. Thereafter, the solder bump 36 is formed on the barrier layer 34. In an embodiment, when the openings 32a and 32b are partially filled with the barrier layer 34, the formation of the solder bump 36 can extend into the openings 32a and 32b to contact the barrier layer 34. This completes a bump structure 38II including the barrier layer 34 and the solder bump 36.

Figure 6:
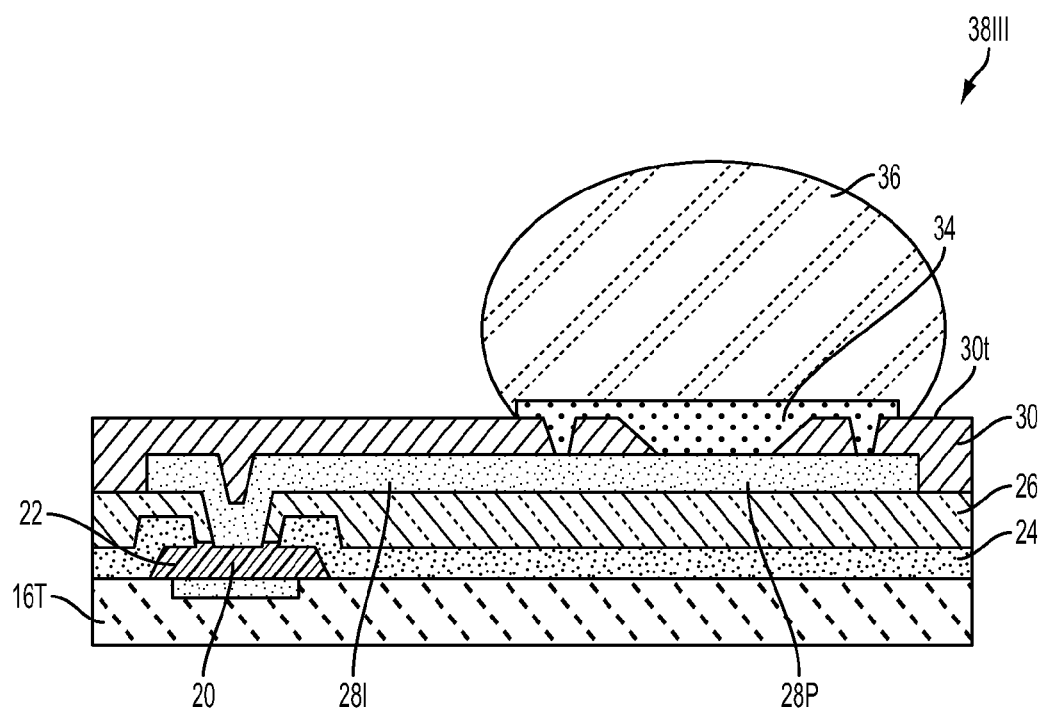
FIG. 6 is a cross-sectional view of a bump structure formed on a PPI structure in accordance with another exemplary embodiment.

FIG. 6 is a cross-sectional view illustrating another bump structure formed on the PPI structure according to an embodiment. Unless specified otherwise, the reference numerals in the embodiment represent like elements in the embodiment illustrated in FIGS. 1-5. The barrier layer 34 is formed in the openings 32a and 32b and also extends onto the top surface 30t of the second protective layer 30. The solder bump 36 is then formed on the barrier layer 34 to complete a bump structure 38III. In an embodiment, when the openings 32a and 32b are fully filled with the barrier layer 34, the formation of the solder bump 36 does not extend into the openings 32a and 32b.

Figure 7:
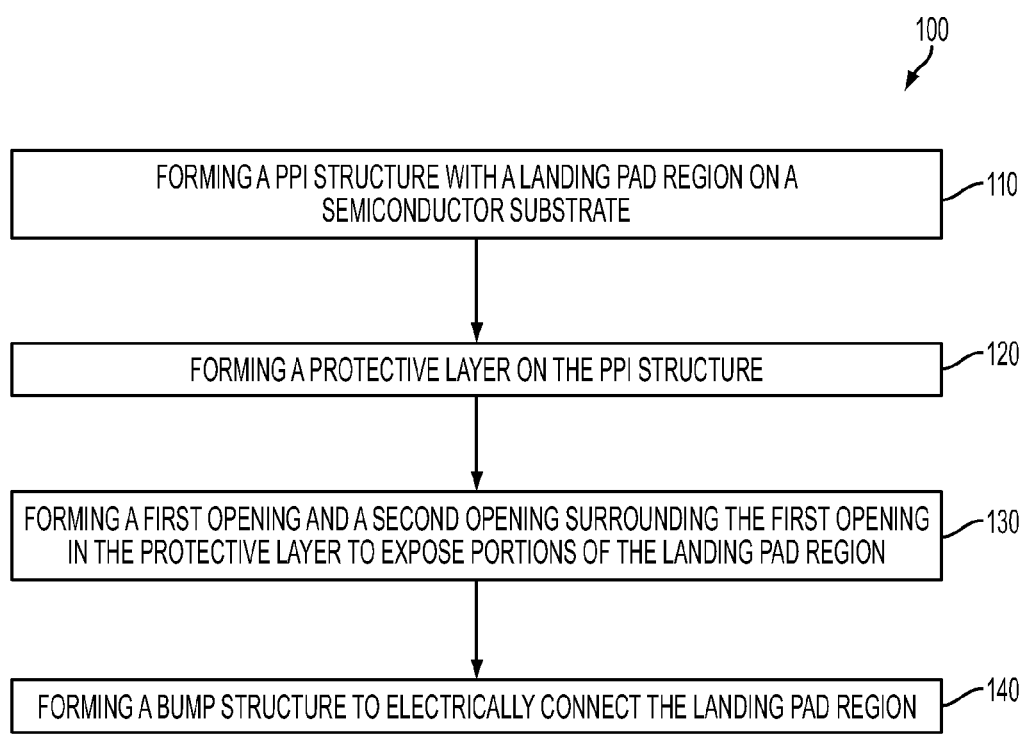
FIG. 7 is a flow chart illustrating a method of forming a bump structure on a PPI structure in accordance with an exemplary embodiment.

FIG. 7 is a flow chart of the method 100 of forming a bump structure on a PPI structure according to various aspects of the present disclosure. The method 100 begins with block 110 in which a PPI structure with a landing pad region is formed on a semiconductor substrate. The method 100 continues with block 120 in which a protective layer is formed on the PPI structure. In an embodiment, the protective layer is a polymer layer. The method 100 continues with block 130 in which a first opening and a second opening are formed in the protective layer to expose portions of the landing pad region. In an embodiment, the second opening is a ring-shaped opening surrounding the first opening. In some embodiments, the second opening is a continuous ring-shaped opening or a discontinuous ring-shaped opening including at least two separated sub-openings. The method 100 continues with block 140 in which a bump structure is formed to electrically connect the landing pad region through the first opening and the second opening. In an embodiment, the bump structure comprises a solder bump. In some embodiments, the bump structure comprises a barrier layer and a solder bump formed on the barrier layer. The barrier layer may be formed of one or more than one electroless metal layers.

In accordance with one aspect of the exemplary embodiments, a semiconductor device includes a passivation layer overlying a semiconductor substrate, an interconnect structure overlying the passivation layer, a protective layer overlying the interconnect layer and a bump structure formed overlying the protective layer. The protective layer includes a first opening and a second opening exposing portions of the interconnect layer, and the first opening is surrounded by the second opening. The bump structure is electrically connected to the interconnect structure through the first opening and the second opening. In an embodiment, the second opening is a continuous ring-shaped opening. In another embodiment, the second opening is a discontinuous ring-shaped opening which includes at least two separated sub-openings. In at least one embodiment, the bump structure fills the first opening and the second opening. In an embodiment, the bump structure comprises a solder bump. The solder bump may fill the first opening and the second opening. In an embodiment, the bump structure includes a barrier layer formed between the solder bump and the interconnect layer. The barrier layer may partially fill or completely fill the first opening and the second opening. The barrier layer in the second opening may be higher than that in the first opening. In an embodiment, the barrier layer extends to the top surface of the protective layer. In an embodiment, the barrier layer includes at least one of a nickel (Ni) layer, a palladium (Pd) layer or a gold (Au) layer. In an embodiment, the protective layer comprises polymer, and the interconnect layer comprises copper.

In accordance with another aspect of the exemplary embodiments, a method includes forming a metallization layer overlying a semiconductor substrate; forming a polymer layer overlying the metallization layer; forming a first opening in the polymer layer to expose a first portion of the metallization layer; forming a second opening in the polymer layer to expose a second portion of the metallization layer; and forming a solder bump overlying the polymer layer. The second opening surrounds the first opening, and the solder bump is electrically connected to the interconnect structure through the first opening and the second opening. In an embodiment, the second opening is a continuous ring-shaped opening. In another embodiment, the second opening is a discontinuous ring-shaped opening including at least two separated sub-openings. In an embodiment, the method further includes forming one or more than one electroless metal layers between the metallization layer and the solder bump. In an embodiment, the electroless metal layer includes at least one of a nickel (Ni) layer, a palladium (Pd) layer or a gold (Au) layer. In an embodiment, the solder bump is formed by placing a solder ball and reflowing the solder ball.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor device, comprising:
   a passivation layer overlying a semiconductor substrate;
   an interconnect structure overlying the passivation layer;
   a protective layer overlying the interconnect structure and comprising a first opening and a second opening exposing portions of the interconnect structure, wherein the first opening is surrounded by the second opening, and the first opening is separated from the second opening by at least a portion of the protective layer, and the second opening is located closer to an edge of a landing pad region than the first opening;
   a barrier layer within the first opening and the second opening; and
   a continuous bump structure overlying the protective layer and electrically connected to the interconnect structure through the first opening and the second opening, wherein the continuous bump structure extends into at least one of the first opening or the second opening.

2. The semiconductor device of claim 1, wherein the second opening is a continuous ring-shaped opening.

3. The semiconductor device of claim 1, wherein the second opening is a discontinuous ring-shaped opening.

4. The semiconductor device of claim 3, wherein the second opening comprises at least two separated sub-openings.

5. The semiconductor device of claim 1, the solder bump extends into both the first opening and the second opening.

6. The semiconductor device of claim 1, wherein the bump structure comprises a solder bump.

7. The semiconductor device of claim 6, wherein the solder bump partially fills the first opening and the second opening.

8. The semiconductor device of claim 6, wherein the barrier layer is between the solder bump and the interconnect structure.

9. The semiconductor device of claim 8, wherein a top surface of the barrier layer is below a top surface of the protective layer.

10. The semiconductor device of claim 8, wherein the barrier layer comprises at least one of a nickel (Ni) layer, a palladium (Pd) layer or a gold (Au) layer.

11. The semiconductor device of claim 1, wherein the protective layer comprises a polymer, and the interconnect structure comprises copper.

12. A semiconductor device, comprising:
   an interconnect structure over a substrate;
   a protective layer over the interconnect structure and comprising a first opening and a second opening, wherein each of the first opening and the second opening expose portions of the interconnect structure, the first opening is at least partially surrounded by the second opening, the second opening is located closer to an edge of a landing pad region than the first opening, and the first opening is separated from the second opening by at least a portion of the protective layer;
   a barrier layer in the first opening and in the second opening, wherein the barrier layer fills less than an entirety of the first opening and the second opening; and
   a bump structure over the barrier layer and electrically connected to the interconnect structure, wherein the bump structure comprises a solder bump extending into at least one of the first opening or the second opening.

13. The semiconductor device of claim 12, wherein a ratio of a height of the second opening to a height of the first opening of the barrier layer ranges from about 1.0 to about 1.5.

14. The semiconductor device of claim 12, wherein a top surface of the barrier layer is above a top surface of the protective layer.

15. The semiconductor device of claim 12, wherein the second opening comprises a first sub-opening separated from a second sub-opening by a distance, wherein the distance ranges from about 1 micron µm) and about 30 µm.

16. The semiconductor device of claim 12, wherein the interconnect structure comprises a landing pad region configured to electrically connect to the bump structure, wherein a distance from an outer edge of the second opening to an outer edge of the landing pad region ranges from about 1 µm to about 10 µm.

17. A semiconductor device, comprising:
 an interconnect structure over a substrate, wherein the interconnect structure includes a landing pad region;
 a protective layer over the interconnect structure;
 a first opening in the protective layer, the first opening exposing the landing pad region;
 at least one second opening in the protective layer, each second opening of the at least one second opening exposing the landing pad region, wherein the at least one second opening is located closer to an outer edge of the landing pad region than the first opening, and the first opening is separated from the second opening by at least a portion of the protective layer;
 a barrier layer partially filling the first opening and the at least one second opening; and
 a bump structure over the barrier layer and electrically connected to the landing pad region, wherein the bump structure comprises a solder bump extending into at least one of the first opening or the second opening.

18. The semiconductor device of claim 17, wherein the barrier layer in the second opening is thicker than the barrier layer in the first opening.

19. The semiconductor device of claim 17, wherein the solder bump extends into both of the first opening and the second opening.

20. The semiconductor device of claim 17, wherein the second opening is a discontinuous ring-shaped opening.

\* \* \* \* \*